United States Patent [19]

Whitfield

[11] Patent Number: 4,951,049
[45] Date of Patent: Aug. 21, 1990

[54] SELF CLOCKING BINARY INFORMATION ENCODER

[75] Inventor: Arthur A. Whitfield, Rochester, N.Y.

[73] Assignee: Eastman Kodak Company, Rochester, N.Y.

[21] Appl. No.: 327,071

[22] Filed: Mar. 22, 1989

[51] Int. Cl.⁵ .............................................. H03M 5/06
[52] U.S. Cl. ........................................ 341/64; 341/52; 360/44
[58] Field of Search ........................ 341/50, 52, 53, 54, 341/55, 63, 64, 67, 68, 69, 70, 71, 72, 73, 74; 360/40, 44, 48, 51; 375/20, 21, 110

[56] References Cited

U.S. PATENT DOCUMENTS 3,961,367  6/1976  Wu .......................................... 360/44
4,173,026 10/1979  Deming ................................. 360/44

Primary Examiner—William M. Shoop, Jr.
Assistant Examiner—H. L. Williams
Attorney, Agent, or Firm—Francis H. Boos

[57] ABSTRACT

An electrical circuit suitable for encoding binary information, in accordance with a novel modulation method, is provided. The encoder circuit includes: a clock driver; an n-phase counter driven by the clock driver for producing a succession of event-cells, wherein each event-cell is demarcated by a pair of similar, unique clock transitions; first logic circuitry for generating a first transitional event in a first event-cell in response to a first information; and second logic circuitry for generating a second transitional event in a second event-cell in response to a second information, the first transitional event and the second transitional event differing by the number of transitions occurring per event-cell. A specific, preferred encoder circuit embodiment is set forth.

12 Claims, 1 Drawing Sheet

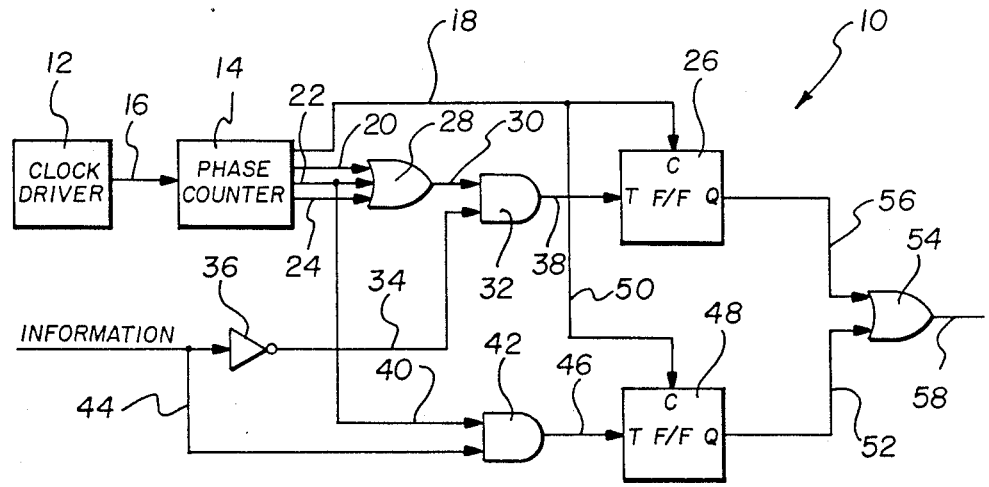
FIG. 1
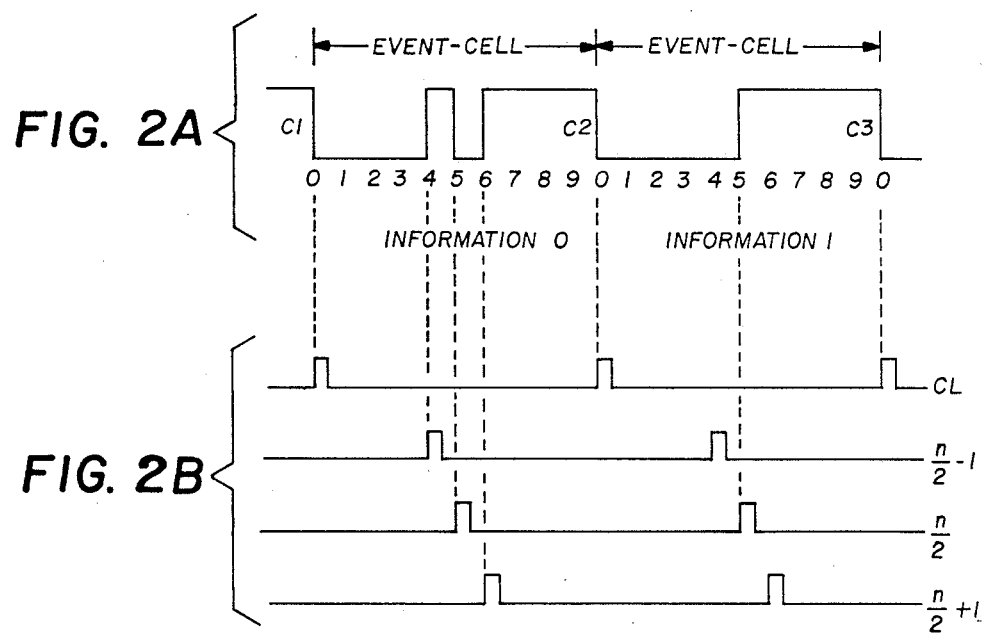
FIG. 2A
FIG. 2B

SELF CLOCKING BINARY INFORMATION ENCODER

CROSS-REFERENCE TO RELATED APPLICATIONS

This application is related to application Ser. No. 206,407 filed June 14, 1988, by Wash; to application Ser. No. 206,408 filed June 14, 1988 by Whitfield et al.; to application Ser. No. 206,553 filed June 14, 1988, by Whitfield; to application Ser. No. 206,646 filed June 14, 1988 by Wash; to application Ser. No. 327,073 filed Mar. 22, 1989, by C. Chi, which is being filed contemporaneously with this application; and to application Ser. No. 327,068 filed on Mar. 22, 1989 by F. Silva, which is being filed contemporaneously with this application. The entire disclosures of each of these applications are incorporated by reference herein. Each of these applications is copending and commonly assigned.

FIELD OF THE INVENTION

This invention relates to electrical circuits suitable for encoding binary information, in accordance with a novel modulation method.

INTRODUCTION TO THE INVENTION

A novel method for modulating binary data or information into a format suitable for encoding and decoding e.g., magnetic information or optical information, is disclosed in the above-cited application Ser. No. 327,073 to C. Chi. The novel method features self-clocking, velocity insensitive encoding and decoding. The Chi disclosure states that preferred electrical circuits that may be employed for realizing the encoding scheme set forth in that disclosure are provided in the present application. This application, therefore, provides novel electrical circuits that may be advantageously employed, for example, for encoding binary data or information into a format in accordance with the Chi disclosure. The novel electrical circuits encode the data, and preserve the self-clocking, velocity insensitive features of the novel method.

SUMMARY OF THE INVENTION

The novel method of Chi is first set forth, in order to provide a perspective for the present invention.

Accordingly, Chi discloses a method for modulating binary data comprising first and second information, the method comprising:

(1) defining an event-cell as the time between two adjacent clock transitions, the clock transitions having a unique characteristic; and (2) selectively writing the information into the event-cell at an arbitrary time, by (i) generating a first event and a corresponding first read signal, in response to the first information; or (ii) generating a second event and a corresponding second read signal, in response to the second information.

With the intent of providing a means for realizing the Chi method, I now disclose an electrical circuit suitable for encoding binary data comprising first and second information, the electrical circuit comprising:

(1) a clock driver;

(2) an n-phase counter driven by the clock driver, the counter comprising (a) means for producing a succession of event-cells;

(b) means for demarcating, in a first event-cell, an arbitrary location of a first event, in response to a first information; and (c) means for demarcating, in a second event-cell, an arbitrary location of a second event, in response to a second information;

(3) first means for generating a first event in the first location, in response to a first information; and (4) second means for generating a second event in the second location, in response to a second information.

BRIEF DESCRIPTION OF THE DRAWINGS

The invention is illustrated in the accompanying drawing, in which:

FIG. 1 is a circuit diagram of the present invention; and

FIGS. 2A, B show waveforms processed by the FIG. 1 circuit.

DETAILED DESCRIPTION OF THE INVENTION

I now disclose preferred aspects of the present invention summarized above.

The clock driver preferably outputs a pulse train having an arbitrary, but constant frequency. A selected frequency helps determine the duration or length of an event-cell, and this duration, in turn, may depend on the ultimate employment of the circuit, for example, as an optical or magnetic encoder. A conventional clock driver may be employed for these purposes.

The n-phase counter, driven by the clock driver, comprises means for producing a succession of event-cells, and demarcates a succession of event-cells by a set of unique clock transitions. For example, unique clock transitions can be defined as those having an invariant negative polarity. Associated with this point, the first and second means for generating the first and second events, respectively, leave invariant the set of unique clock transitions. A conventional n-phase counter may be employed for these purposes.

Preferably, an event-cell for a first information is defined by a duration t, and has n sub-units, each of duration $\delta = t/n$; and the means for demarcating the first location in the first event-cell comprises serial first, second and third clock signals located at $n/2-1$, $n/2$, $n/2+1$, respectively.

Preferably, an event-cell for a second information is defined by a duration t, and has n sub-units, each of duration $\gamma = t/n$; and the means for demarcating the second location in the second event-cell comprises a single clock signal located at $t/2$.

Preferably, the first means for generating the first event comprises a logic circuit that functions so that, if its inputs are the first information and the first or second or third clock signals, then its output generates alternate information transitions at the locations $n/2-1$, $n/2$, $n/2+1$, respectively.

Preferably, the second means for generating the second event comprises a logic circuit that functions so that, if its inputs are the second information and the single clock signal, then its output generates an information transition at the location $n/2$.

Note that the first and second means provide a twofold function, viz., they operate to provide discrimination of the first and second informations, and they leave invariant the unique clock transition characteristic.

Attention is now directed to FIG. 1, which shows a circuit 10 of the present invention. The structure of the circuit 10 is first disclosed, followed by its operation.

Accordingly, the circuit 10 comprises a clock driver 12, and an n-phase counter 14 (n=10) connected and driven by the clock driver 12, along a line 16. The n-phase counter 14 can provide four clock signal outputs, labeled Clock (CL), $n/2-1$, $n/2$, $n/2+1$, along lines 18, 20, 22, 24, and can reset or recycle at the count 10. Further, the clock signal (CL) output is an input, along the line 18, to a toggle flip-flop 26; and the other signal outputs, namely $n/2-1$, $n/2$, $n/2+1$, are inputs along the lines 20, 22, 24 respectively, to an OR gate 28.

An output of the OR gate 28 becomes a first input, along a line 30, to an AND gate 32. A second input to the AND gate 32, along a line 34, carries the inverted first and second informations, i.e., digital 1's and 0's, as inverted by an inverter 36. The output of the AND gate 32 is a second input to the toggle flip-flop 26, along a line 38.

The circuit 10 is completed by observing that the clock signal output $n/2$ is a first input, along a line 40, to a (second) AND gate 42. A second input to the AND gate 42, along a line 44, carries the first and second informations, i.e., digital 1's and 0's. The output of the AND gate 42, along a line 46, becomes an input to a latching or delay flip-flop 48. The latching flip-flop 48 receives, as well, the clock signal (CL) along a line 50, and outputs a signal, along a line 52, to an OR gate 54. The OR gate 54 also receives an input signal along a line 56, from the toggle flip-flop 26. The output of the OR gate 54, on a line 58, completes the structure of the circuit 10.

The operation of the FIG. 1 circuit 10 will now be disclosed, and reference additionally will be made to the waveforms shown in FIGS. 2A, B. An objective of the operation of the circuit 10 is to encode a first binary information "0", in a first event-cell, and then a second binary information "1", in a second event-cell.

To this end, a leading edge of the first event-cell is produced by the combined operation of the clock driver 12, the 10-phase counter 14, and the flip-flops 26, 48. That is, in response to the pulse train outputted by the clock driver 12 along the line 16, the 10-phase counter 14 outputs a first negative clock transition, $C_1$, by way of preset lines (not shown), along the lines 18 and 50, to the clear operations of the toggle flip-flop 26 and latching flip-flop 48, respectively (See FIG. 2B). The flip-flops 26, 48, in turn, output (in this illustrative embodiment) a logic 0. This logic 0 output is provided, regardless of the state the flip-flops 26, 48 may previously have been in, i.e., a logic 0 or logic 1. Accordingly, the logic 0 outputted by the flip-flops 26, 48, in turn, become logic 0 inputs to the OR gate 54. The OR operation results in a logic 0 on the circuit 10 output line 58, and corresponds to the FIG. 2A leading edge ($C_1$) of the first event-cell.

As stated, it is desired to encode the first information 0 in the first event-cell. This may be accomplished by a first means for generating a first event. The first means comprises the logic elements 28, 32, 26, 54, which elements function so that, if its inputs are the first information 0 and the clock signals $n/2-1$ or $n/2$ or $n/2+1$, then its output generates alternate information transitions (the first event) at the first event-cell locations $n/2-1$, $n/2$, $n/2+1$, respectively, as shown in FIG. 2A. Note that for this illustrative embodiment, n=10, so that the first event-cell locations are identified as 4, 5, 6, in FIG. 2A.

The last paragraph is expanded upon as follows. The logic element 28, the OR gate, outputs a logic 1 in response to three successive clock signals, namely $n/2-1$, $n/2$, $n/2+1$ (FIG. 2B). The logic 1 becomes the line 30 input to the AND gate 32. The AND gate 32 outputs a logic 11, along the line 38, for each of the three successive clock signals, since its two inputs, line 30 and line 34, each are logic 1. (To this end, note the operation of the inverter 36 on the information 0, to generate a logic 1 on the line 34). Continuing, the line 38 logic 1 input to the toggle flip-flop 26, has the effect of successively toggling the flip-flop 26, for each of the successive clock signals $n/2-1$, $n/2$, $n/2+1$. The toggling action, as carried over by the OR gate 54, produces three successive information transitions at the first event-cell locations 4, 5, 6, corresponding to the clock signals $n/2-1$, $n/2$, $n/2+1$, respectively.

The trailing edge of the first event-cell, at location $C_2$, is now generated in a manner analogous to that of the leading edge $C_1$, above. That is, the clock 12 and 10-phase counter 14, in combination with the input on lines 18, 50 to the flip-flops 26, 48 clear operation, results (by way of the OR gate 54) in the circuit 10 output line 58 making a transition to logic 0, as shown in FIG. 2A.

The first information 0 has now been encoded: the 10-phase counter 14 is reset (FIG. 2B), and the circuit 10 can now encode the information 1 in a second event-cell. This may be accomplished by a second means for generating a second event. The second means comprises the logic elements 42, 48, 54, which elements function so that, if its inputs are the second information and the single clock transition $n/2$, then its output generates an information transition at the location $n/2$, as shown in FIG. 2A.

The last paragraph is expanded upon as follows. The logic element 42, the AND gate, outputs a logic 1 only when its inputs on lines 44, 40 are logic 1. This last case only occurs at the time of the single clock transition $n/2$ (see FIG. 2B). Continuing, the AND gate 42 output, on the line 46, in turn, becomes an input to the latching flip-flop 48. The flip-flop 48 provides an output information transition (logic 1) in response to this input, and outputs the information transition to the circuit 10 output line 58, by way of the OR gate 54. The flip-flop 48 holds the logic 1 until the advent of a subsequent line 50 clock signal input. This last clock signal clears the flip-flop 48, as well as the flip-flop 26 (by way of line 18), thus generating a trailing edge of the second event-cell ($C_3$), shown in FIG. 2A. The timing signals for this last operation are shown in FIG. 2B.

The operation of the circuit 10 has now been disclosed, and the following observations are made. First, it is noted that the AND gates 32, 42 function to isolate the first and second event generating means. Thus, inspection of FIG. 1 shows that the AND gate 32 provides an isolation capability for the second event generating means, while conversely, the AND Gate 42 provides an isolation capability for the first event generating means.

Further, it is noted that the first and second event generating means provide at least a three-fold function: viz., (1) they may be located at any arbitrary location within an event-cell; (2) they leave invariant the (unique) negative clock transition defining the advent of the succession of event-cells; and (3) they operate to provide encoded discrimination of the first and second informations. On the last point: the first and second events, namely the alternating sequential first information transitions, versus the single second information transitions, are such that in a (downstream) decoding or reading operation, the encoded information can be readily recovered.

Finally, in alternative embodiments (not shown), it is possible to locate the alternating sequential first informations at other arbitrary locations, for example, at clock locations 6, 7, 8; and to locate the single information transition at another arbitrary location, say, location 3. However, the FIG. 2 locations are preferred because they help minimize problems of noise or discrimination ambiguities. Related to this is the point that, in alternative embodiments, it is possible to generate first events comprising an arbitrary large odd number of alternating sequential first information transitions, and to generate more complex second events. But in all alternative embodiments, the generated first and second events will be such that they leave invariant the clock transition polarity, and ensure first and second information discrimination.

The Chi method can also be encoded by a software program running in a microprocessor, computer, or microcomputer, and in accordance with the claimed invention summarized above. The benefits of using this software approach depend on a specific application. A suitable software encoding routine written in BASIC computer language is listed below. While this routine is not the only software approach to encoding the Chi method, it is representative of what can be done in many cases.

ond information, said first transitional event and said second transitional event differing in the number of transitions per event-cell.

2. A circuit according to claim 1, wherein the clock driver has a constant frequency.

3. A circuit according to claim 1, wherein the first and second means for generating said first and second events respectively, leave invariant the set of unique clock transitions.

4. A circuit according to claim 1, wherein
(i) the event-cell for a first information is defined by a duration t, and has n sub-units, each of duration $\delta = t/n$; and
(ii) the means for demarcating the first location in the event-cell for the first information comprises serial first, second and third clock signals located at $n/2-1, n/2, n/2+1$.

5. A circuit according to claim 1, wherein
(i) the event-cell for a second information is defined by a duration t, and has n sub-units, each of duration $\gamma = t/n$; and
(ii) the means for demarcating the second location in the event-cell for the second information comprises a single clock signal located at $n/2$.

6. A circuit according to claim 4, wherein the first means for generating the first event comprises a logic circuit that functions so that, if its inputs are the first information and the first or second or third clock signals, then its output generates alternate information transitions at the locations $n/2-1, n/2, n/2+1$, respectively.

7. A circuit according to claim 5, wherein the second means for generating the second event comprises a logic

```
10   REM ** CONSTANT CLOCK ENCODING ROUTINE **
20   K=10                        SUBDIVISIONS OF EVENT CELL
30   DIM ARRAYl(DATAQTY*K)       ARRAY FOR OUTPUT STREAM
40   DIM DATA(DATAQTY)           ARRAY FOR INPUT BINARY DATA
50   I=0                         SET OUTPUT ARRAY POINTER
60   FOR J=1 TO DATA156          LOOP THROUGH BINARY DATA
70   FOR N=0 TO K-1              LOOP THROUGH SUBDIVISIONS
80   IF N=3 AND DATA(J)=0 THEN ARRAYl(I)=1
90   IF N=4 AND DATA(J)=0 THEN ARRAYl(I)=0
100  IF N=4 AND DATA(J)=1 THEN ARRAYl(I)=1
110  IF N=5 AND DATA(J)=0 THEN ARRAYl(I)=1
120  IF N<>3 OR 4 OR 5 THEN ARRAYl(I)=0
130  I=I+1                       INCREMENT OUTPUT ARRAY PTR
140  NEXT N                      STEP TO NEXT SUBDIVISION
150  NEXT J                      GET NEXT BINARY DATA BIT
```

What is claimed is:

1. A circuit for encoding binary data comprising first and second information, the circuit comprising:
   (i) a clock driver;
   (ii) an n-phase counter driven by the clock driver, the counter comprising
      (a) means for producing a succession of event-cells, wherein each event-cell is demarcated by a pair of similar, unique clock transitions;
      (b) means for demarcating, in a first event-cell, a first location of a first event in response to a first information; and
      (c) means for demarcating, in a second event-cell, a second location of a second event in response to a second information;
   (iii) first means for generating a first transitional event in the first location, in response to a first information; and
   (iv) second means for generating a second transitional event in the second location, in response to a seccircuit that functions so that, if its inputs are the second information and the single clock signal, then its output generates an information transition at the location $n/2$.

8. A circuit according to claim 1, wherein the first event generated by said first generating means comprises multiple alternate information transitions.

9. A circuit according to claim 8, wherein in the first event-cell is defined by a duration t divided into sub-units, and the multiple alternate information transitions occur at sequential cell sub-units at the first location within the first event-cell.

10. A circuit for encoding binary data comprising first and second information, the circuit comprising:
   (a) clocking means for producing a succession of event-cells, wherein each event-cell is demarcated by a pair of similar, unique clock transitions;
   (b) first means for generating a first transitional event within a first event-cell in response to a first information; and (c) second means for generating a second transitional event in a second event-cell in response to a second information, said first and second means generating a first transitional event and a second transitional event having a different number of information transitions per event-cell.

11. A circuit according to claim 10, further comprising means for demarcating a first location for the first transitional event within the first event-cell and means for demarcating a second location for the second transitional event within the second event-cell.

12. A circuit according to claim 10, wherein the first and second transitional events each comprise an odd number of information transitions.

* * * * *